US010679844B2

(12) United States Patent
Truong et al.

(10) Patent No.: US 10,679,844 B2
(45) Date of Patent: Jun. 9, 2020

(54) OPTIMAL EXPOSURE OF A BOTTOM SURFACE OF A SUBSTRATE MATERIAL AND/OR EDGES THEREOF FOR CLEANING IN A SPIN COATING DEVICE

(71) Applicants: Thanh Truong, Ho Chi Minh (VN); Tri Dang, Ho Chi Minh (VN); Tu Tran, Ho Chi Minh (VN); Hieu Charlie Nguyen, San Jose, CA (US)

(72) Inventors: Thanh Truong, Ho Chi Minh (VN); Tri Dang, Ho Chi Minh (VN); Tu Tran, Ho Chi Minh (VN); Hieu Charlie Nguyen, San Jose, CA (US)

(73) Assignee: C&D SEMICONDUCTOR SERVICES, INC., San Jose, CA (US)

(*) Notice: Subject to any disclaimer, the term of this patent is extended or adjusted under 35 U.S.C. 154(b) by 0 days.

(21) Appl. No.: 16/459,613

(22) Filed: Jul. 2, 2019

(65) Prior Publication Data
US 2020/0013614 A1 Jan. 9, 2020

Related U.S. Application Data

(60) Provisional application No. 62/695,826, filed on Jul. 9, 2018.

(51) Int. Cl.
*H01L 21/02* (2006.01)
*G03F 7/16* (2006.01)
(Continued)

(52) U.S. Cl.
CPC ........ *H01L 21/02087* (2013.01); *B05C 11/08* (2013.01); *B08B 3/022* (2013.01);
(Continued)

(58) Field of Classification Search
CPC ........... H01L 21/0209; H01L 21/02087; H01L 21/67051; H01L 21/67017; G03F 7/162
See application file for complete search history.

(56) References Cited

U.S. PATENT DOCUMENTS 5,908,661 A  6/1999  Batcheldor et al.
5,913,631 A  6/1999  Mahneke
(Continued)

FOREIGN PATENT DOCUMENTS

CN  105304522 A  2/2016
JP  2000183014 A  6/2000
(Continued)

OTHER PUBLICATIONS

"SynchroSpin® Coating System" by C&D Semiconductor Services, Found Online on [Jun. 17, 2019] https://cdsemi.com/products/synchrospin-coating-system.
(Continued)

*Primary Examiner* — Binu Thomas
(74) *Attorney, Agent, or Firm* — Legalforce RAPC Worldwide

(57) ABSTRACT

A spin coating device includes a base plate, a spin chuck on which a substrate material is placed, and an actuator mechanism to engage the base plate with the spin chuck such that the base plate synchronously spins along with the spin chuck. The substrate material includes a top surface coated with a film-forming substance and a bottom surface. The cleaning mechanism is below the base plate and out of optimal exposure to the bottom surface and edges of the substrate material in a state of base plate engagement. In response to disengagement of a lid configured to synchronously co-rotate with the base plate, the actuator mechanism is further configured to disengage the base plate from the spin chuck and to enable the optimal exposure of the
(Continued)

cleaning mechanism to the bottom surface and the edges of the substrate material.

7 Claims, 7 Drawing Sheets

(51) Int. Cl.
*B05C 11/08* (2006.01)
*H01L 21/67* (2006.01)
*B08B 3/02* (2006.01)
*H01L 21/687* (2006.01)

(52) U.S. Cl.
CPC .......... *G03F 7/162* (2013.01); *H01L 21/0209* (2013.01); *H01L 21/67051* (2013.01); *H01L 21/68785* (2013.01)

(56) References Cited

U.S. PATENT DOCUMENTS

| | | | |
|---|---|---|---|
| 5,913,979 A | 6/1999 | Shen et al. | |
| 6,159,288 A * | 12/2000 | Satou | B05C 11/08 118/52 |
| 6,309,981 B1 | 10/2001 | Mayer et al. | |
| 6,453,916 B1 | 9/2002 | Tran | |
| 6,495,312 B1 | 12/2002 | Young et al. | |
| 6,506,689 B2 | 1/2003 | Rolfson | |
| 6,516,815 B1 | 2/2003 | Stevens et al. | |
| 6,786,996 B2 | 9/2004 | Emami | |
| 7,037,853 B2 | 5/2006 | Hongo et al. | |
| 7,168,607 B2 | 1/2007 | Ehrke et al. | |
| 7,247,209 B2 | 7/2007 | Robertson et al. | |
| 7,673,582 B2 | 3/2010 | Winter | |
| 7,691,559 B2 | 4/2010 | Chang et al. | |
| 8,657,963 B2 | 2/2014 | Yeh et al. | |
| 9,821,348 B2 | 11/2017 | Wu et al. | |
| 9,960,056 B2 | 5/2018 | Dobashi et al. | |
| 2001/0009814 A1 | 7/2001 | Rolfson | |
| 2004/0250839 A1 | 12/2004 | Robertson et al. | |
| 2006/0137714 A1 | 6/2006 | Hong | |
| 2008/0081110 A1* | 4/2008 | Winter | H01L 21/6708 427/240 |
| 2009/0211602 A1 | 8/2009 | Winter et al. | |
| 2012/0183693 A1* | 7/2012 | Ogata | H01L 21/67051 427/299 |
| 2014/0261163 A1* | 9/2014 | Kishita | H01L 21/67051 118/52 |
| 2016/0322240 A1 | 11/2016 | Lee et al. | |
| 2016/0372317 A1 | 12/2016 | Lee et al. | |
| 2017/0140917 A1* | 5/2017 | Yoshida | H01L 21/67051 |

FOREIGN PATENT DOCUMENTS

| | | |
|---|---|---|
| JP | 2005123218 A | 5/2005 |
| KR | 100549265 B1 | 2/2006 |
| KR | 20100136835 A | 12/2010 |
| WO | 2002067294 A2 | 8/2002 |

OTHER PUBLICATIONS

"EBR (Edge Bead Remover) PG" by MicroChem, Found Online on [Jun. 17, 2019] http://microchem.com/pdf/ebr/pdf.

"Photoresist Edge Bead Removal Processes" by Ken Bell, Published Online on [Jan. 3, 2017] https://www.doeingalls.com/photoresist-edge-bead-removal-processes/.

* cited by examiner

OPTIMAL EXPOSURE OF A BOTTOM SURFACE OF A SUBSTRATE MATERIAL AND/OR EDGES THEREOF FOR CLEANING IN A SPIN COATING DEVICE

CLAIM OF PRIORITY

This application is a U.S. Utility Conversion Patent Application of U.S. Provisional Patent Application No. 62/695,826 titled METHOD AND SYSTEM FOR PHOTORESIST COATING OF A SEMICONDUCTOR WAFER WITH BACKSIDE EDGE BEAD REMOVAL USING AN EBR NOZZLE filed on Jul. 9, 2018. The content of the aforementioned application is incorporated by reference in entirety thereof.

FIELD OF TECHNOLOGY

This disclosure relates generally to spin coating devices and, more particularly, to optimal exposure of a bottom surface of a substrate material and/or edges thereof for cleaning in a spin coating device.

BACKGROUND

A substrate material (e.g., a semiconductor wafer) may be coated with a film-forming substance (e.g., a photoresist material) on a top surface thereof and placed on a spin chuck of a spin coating device. The spinning of the spin chuck along with the substrate material may distribute the film-forming substance uniformly across the top surface of the substrate material. However, said spinning may also cause build-up of some of the film-forming substance at edges of the substrate material; this spill-over may extend to a bottom surface of the substrate material.

The cleaning of the edge build-up and the spill-over may involve utilizing separate dispense arms or similar elements to clean the bottom surface of the substrate material and/or the edges thereof. This process may lead to chemical/particle contamination with respect to the coated substrate material.

SUMMARY

Disclosed are a method, a device and/or a system of optimal exposure of a bottom surface of a substrate material and/or edges thereof for cleaning in a spin coating device.

In one aspect, a spin coating device includes a base plate, a spin chuck on which a substrate material is configured to be placed, and an actuator mechanism configured to engage the base plate with the spin chuck such that the base plate is configured to synchronously spin along with the spin chuck. The substrate material includes a top surface and a bottom surface, and the top surface is a surface configured to be coated with a film-forming substance. A cleaning mechanism is below the base plate and out of optimal exposure to the bottom surface of the substrate material and edges thereof in a state of the engagement of the base plate with the spin chuck.

In response to disengagement of a lid configured to synchronously co-rotate with the base plate during the synchronous spinning thereof along with the spin chuck from the base plate, the actuator mechanism is further configured to disengage the base plate from the spin chuck to render the spin chuck free of the base plate. The disengagement of the base plate from the spin chuck is configured to lower the base plate such that the cleaning mechanism is optimally exposed to the bottom surface of the substrate material and the edges thereof based on emergence of the cleaning mechanism through the base plate.

In another aspect, a method includes rendering a cleaning mechanism below a base plate of a spin coating device and out of optimal exposure to a bottom surface of a substrate material and edges thereof in a state of engagement of the base plate with a spin chuck of the spin coating device. The spin chuck is configured to have the substrate material including a top surface and the bottom surface placed thereon. The top surface is a surface configured to be coated with a film-forming substance. The base plate is configured to synchronously spin along with the spin chuck with the coated substrate material in the state of engagement.

In response to disengagement of a lid of the spin coating device configured to synchronously co-rotate with the base plate during the synchronous spinning of the base plate along with the spin chuck from the base plate, the method also includes disengaging the base plate from the spin chuck to render the spin chuck free of the base plate, and lowering the base plate in accordance with the disengagement of the base plate from the spin chuck such that the cleaning mechanism is optimally exposed to the bottom surface of the substrate material and the edges thereof based on emergence of the cleaning mechanism through the base plate. Further, the method includes cleaning the bottom surface of the substrate material and/or the edges thereof utilizing the cleaning mechanism based on the optimal exposure.

In yet another aspect, a non-transitory medium, readable through a data processing device and including instructions embodied therein that are executable through the data processing device, includes instructions to control a spin coating device. The control instructions include instructions to render a cleaning mechanism below a base plate of the spin coating device and out of optimal exposure to a bottom surface of a substrate material and edges thereof in a state of engagement of the base plate with a spin chuck of the spin coating device. The spin chuck is configured to have the substrate material including a top surface and the bottom surface placed thereon, and the top surface is a surface configured to be coated with a film-forming substance.

The base plate is configured to synchronously spin along with the spin chuck with the coated substrate material in the state of engagement. In response to disengagement of a lid of the spin coating device configured to synchronously co-rotate with the base plate during the synchronous spinning of the base plate along with the spin chuck from the base plate, the control instructions also include instructions to disengage the base plate from the spin chuck to render the spin chuck free of the base plate, and instructions to lower the base plate in accordance with the disengagement of the base plate from the spin chuck such that the cleaning mechanism is optimally exposed to the bottom surface of the substrate material and the edges thereof based on emergence of the cleaning mechanism through the base plate.

Further, the control instructions include instructions to trigger cleaning of the bottom surface of the substrate material and/or the edges thereof utilizing the cleaning mechanism based on the optimal exposure.

Other features will be apparent from the accompanying drawings and from the detailed description that follows.

BRIEF DESCRIPTION OF THE DRAWINGS

The embodiments of this invention are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Example embodiments, as described below, may be used to provide a method, a device and/or a system of optimal exposure of a bottom surface of a substrate material and/or edges thereof for cleaning in a spin coating device. Although the present embodiments have been described with reference to specific example embodiments, it will be evident that various modifications and changes may be made to these embodiments without departing from the broader spirit and scope of the various embodiments.

Figure 1:
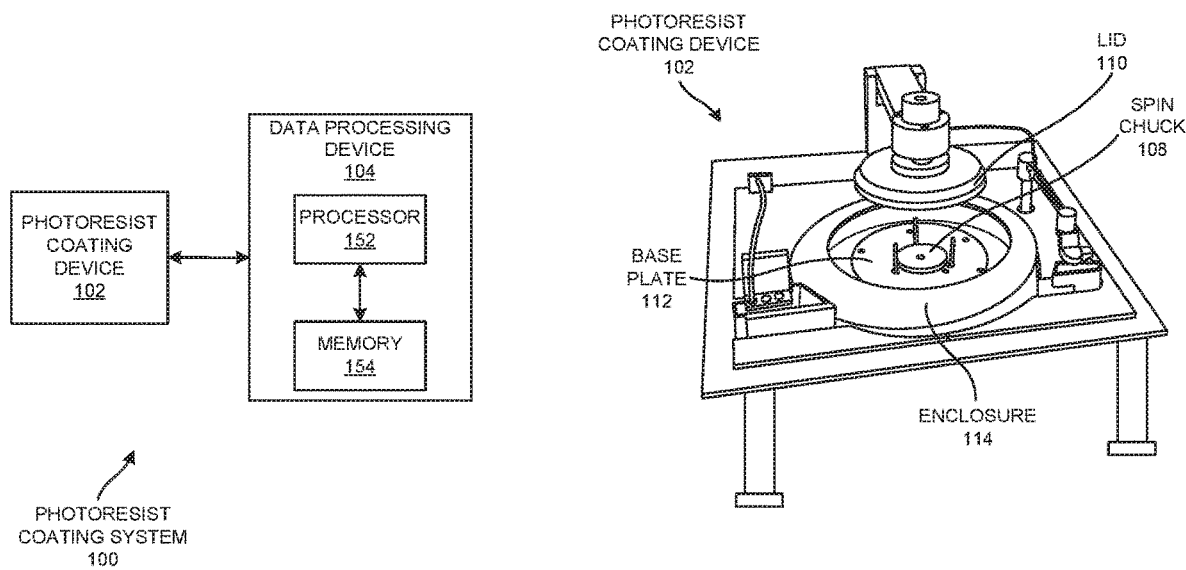
FIG. 1 is a schematic view of a photoresist coating system, according to one or more embodiments.

FIG. 1 shows a photoresist coating system 100, according to one or more embodiments. As implied, in one or more embodiments, photoresist coating system 100 may enable coating of a photoresist (e.g., a light-sensitive material) on a surface (e.g., a substrate of a semiconductor wafer); said photoresist may enable transfer of an image onto the surface. Photoresists are well known to one skilled in the art. Detailed discussion associated therewith has been skipped for the sake of convenience and clarity.

In one or more embodiments, photoresist coating system 100 may include a photoresist coating device 102 configured to coat the surface mentioned above with the photoresist through a spin coating process. While, in some embodiments, photoresist coating device 102, as part of photoresist coating system 100, may be controlled mechanically, electronically and/or electrically, at least some control of photoresist coating device 102 may be accomplished through a data processing device 104 communicatively coupled thereto, as shown in FIG. 1. In these embodiments, data processing device 104 may include a processor 152 (e.g., a microprocessor) communicatively coupled to a memory 154 (e.g., a volatile and/or a non-volatile memory); memory 154 may include storage locations addressable through processor 152; here, processor 152 may perform operations associated with predefined/preconfigured movement(s) of components of photoresist coating device 102.

In one or more embodiments, photoresist coating device 102 may include an enclosure 114 within which a spin chuck 108 and a base plate 112 are operated. In one or more embodiments, spin chuck 108 may be a platform (e.g., circular) on which a semiconductor wafer (to be discussed below) is configured to be placed. In one or more embodiments, spin chuck 108 may be configured to secure the semiconductor wafer thereon firmly and to rotate at a high speed. In one or more embodiments, following application of a photoresist material on a surface of the semiconductor wafer, the rotation of spin chuck 108 may distribute the photoresist material uniformly across the surface.

In one or more embodiments, base plate 112 may be a metal plate positioned below spin chuck 108 within enclosure 114. In one or more embodiments, photoresist coating device 102 may include a lid 110 configured to enable engagement of base plate 112 with spin chuck 108. In one or more embodiments, lid 110 may be operated through an appropriate mechanism (to be discussed below; e.g., based on automatic control through data processing device 104) to be lowered from an initial position to securely engage with base plate 112, which, in turn, engages with spin chuck 108 on which the semiconductor wafer is configured to be placed. In one or more embodiments, lid 110 may also be lifted (e.g., automatically) back to the initial position through the same appropriate mechanism.

Figure 2:
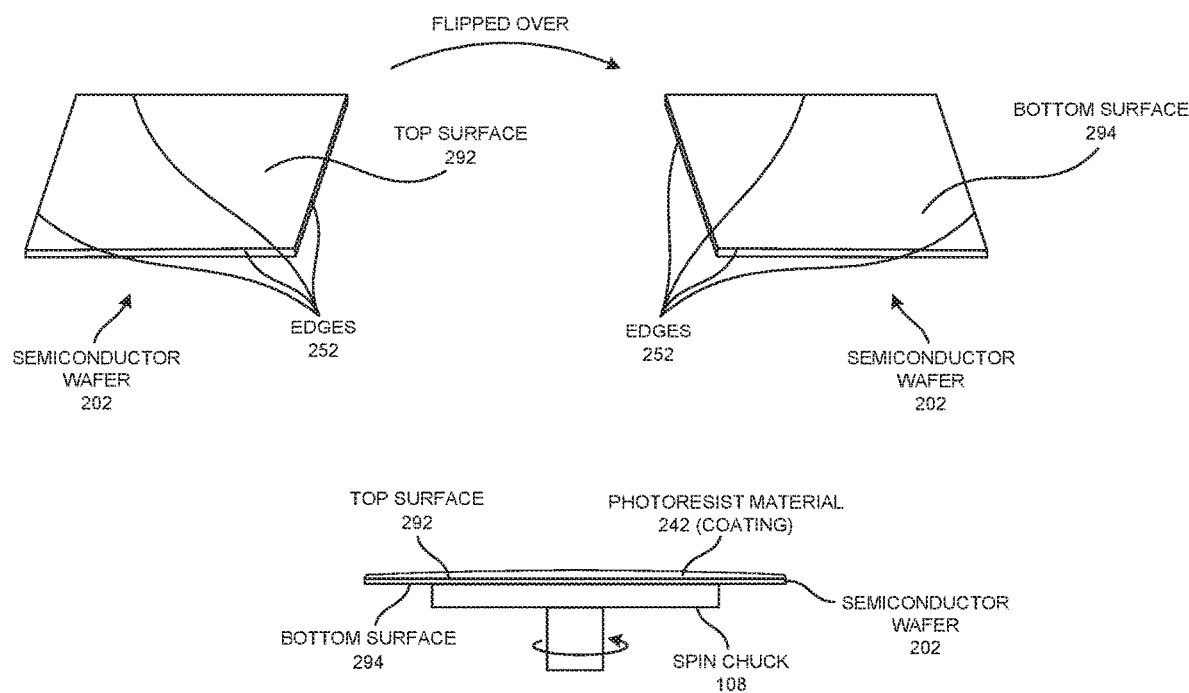
FIG. 2 is a schematic view of a semiconductor wafer configured to be placed on a spin chuck of a photoresist coating device of the photoresist coating system of FIG. 1, according to one or more embodiments.

FIG. 2 shows a semiconductor wafer 202 configured to be placed on spin chuck 108, according to one or more embodiments; in one or more embodiments, said semiconductor wafer 202 may be securely placed on spin chuck 108 based on application of suction to a surface (e.g., bottom surface 294, as shown in FIG. 2) of semiconductor wafer 202 directly in contact with spin chuck 108. Once semiconductor wafer 202 is securely placed on spin chuck 108, photoresist material may be applied on top (e.g., on top surface 292) of semiconductor wafer 202, as shown in FIG. 2. Both manual and automatic means of application of the photoresist material may be envisioned within the scope of the exemplary embodiments discussed herein. In one or more embodiments, spin chuck 108 may be configured to rotate at a high speed, as discussed above, to enable uniform spreading of the photoresist material (e.g., photoresist material 242 shown in FIG. 2) across top surface 292 of semiconductor wafer 202. FIG. 2 also shows edges 252 of semiconductor wafer 202, according to one or more embodiments.

In one or more embodiments, in a synchronized spinning process enabled through photoresist coating device 102, spin chuck 108 including semiconductor wafer 202 coated with photoresist material 242 and base plate 112 may rotate together synchronously. In one or more embodiments, to provide for a low turbulence environment for distribution of photoresist material 242 across top surface 292 of semiconductor wafer 202, lid 110 of photoresist coating device 102 may be lowered to securely lock onto base plate 112 and synchronously co-rotate therewith. In one or more embodiments, said secure locking may result in a co-rotating base plate 112 and lid 110 spinning synchronously along with spin chuck 108 with the coated semiconductor wafer 202 on top.

Figure 3:
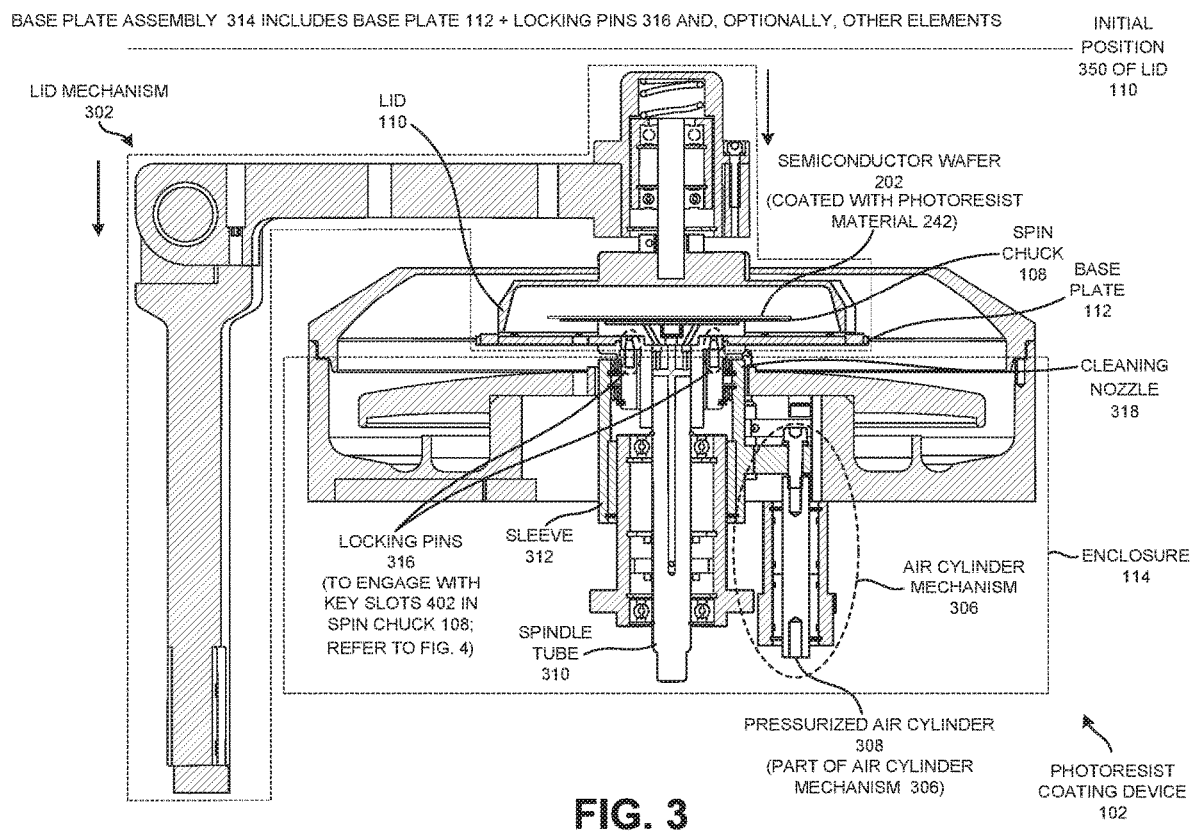
FIG. 3 is a schematic front view of the photoresist coating device of FIG. 1 in which a lid is lowered to engage with a base plate thereof, according to one or more embodiments.

FIG. 3 shows photoresist coating device 102 in which lid 110 is lowered to engage with base plate 112, according to one or more embodiments. It should be noted that FIG. 3 may be a front view of photoresist coating device 102 to reveal mechanisms inherent in operations discussed herein. In one or more embodiments, as discussed above, lid 110 may be lowered from an initial position 350 thereof to lock onto a spinning motion of base plate 112. In one or more embodiments, photoresist coating device 102 may have a lid mechanism 302 to operate lid 110 and move lid 110 from initial position 350 to a lock position thereof with base plate 112. Lid mechanism 302 disclosed in FIG. 3 is only for illustrative purposes. Any lid mechanism 302 enabling the movement of lid 110 discussed above is within the scope of the exemplary embodiments discussed herein.

Also, as seen above, in one or more embodiments, lid mechanism 302 may enable lifting of lid 110 back to initial position 350 from the lock position. In one or more embodiments, photoresist coating device 102 may include an air cylinder mechanism 306 associated therewith by which an air cylinder 308 is pressurized enough to enable raising base plate 112 toward spin chuck 108. In one or more embodiments, the locking of lid 110 with base plate 112 may automatically trigger pressurizing of air cylinder 308 to enable raising base plate 112 toward spin chuck 108.

In one or more embodiments, photoresist coating device 102 may include a spindle tube 310 configured to serve as an axis of rotation of spin chuck 108. In some embodiments, spindle tube 310 may be a component of spin chuck 108 positioned in enclosure 114. In one or more embodiments, spindle tube 310 may be associated with a sleeve 312 configured wrap around spindle tube 310 (e.g., cylindrical in shape). In one or more embodiments, following the locking of lid 110 with base plate 112 (e.g., in response to locking of lid 110 with base plate 112; or, independently therefrom), the pressurizing of air cylinder 308 may enable sleeve 312 to raise base plate 112 toward spin chuck 108 based on communicative coupling between air cylinder mechanism 306, sleeve 312 and base plate 112.

Figure 4:
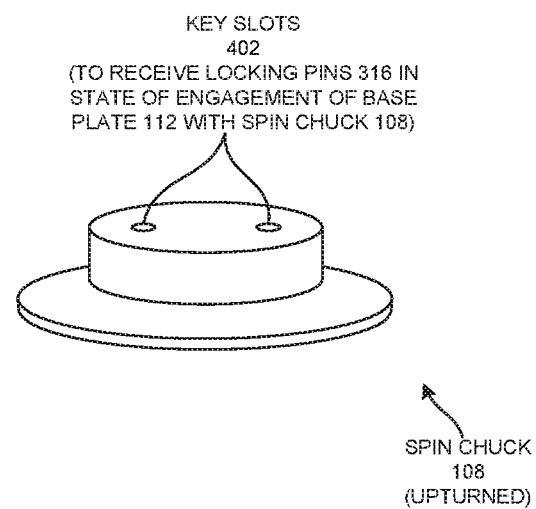
FIG. 4 is a schematic view of key slots on the spin chuck of the photoresist coating device of FIG. 1, according to one or more embodiments.

FIG. 4 shows key slots 402 on spin chuck 108, according to one or more embodiments. Referring back to FIG. 3, base plate 112 may be part of a base plate assembly 314 including a number of locking pins 316 thereon, according to one or more embodiments. FIG. 3 shows two locking pins 316 for the sake of illustrative convenience. In one or more embodiments, the raising of base plate 112 toward spin chuck 108 through sleeve 312 may cause locking pins 316 to engage with key slots 402 in spin chuck 108. In one or more embodiments, said engagement may also lock a motion of base plate 112 with that of spin chuck 108, thereby enabling synchronized spinning thereof. It is to be noted that one or more locking pins 316 and an associated one or more key slots 402 in spin chuck 108 may be sufficient to be covered under the concepts associated with the exemplary embodiments discussed herein.

Further, it should be noted that, in some embodiments, key slots analogous to key slots 402 may be on base plate 112/base plate assembly 314 instead of on spin chuck 108 and locking pins analogous to locking pins 316 may be on spin chuck 108 instead of base plate assembly 314. The engagement/disengagement of locking pins 316 within key slots 402 here may be obvious in view of the other embodiments discussed above.

In typical implementations of photoresist coating, the spinning of photoresist material 242 on semiconductor wafer 202 may cause build-up of some photoresist material 242 at edges 252 of semiconductor wafer 202. Said build-up may spill onto bottom surface 294 of semiconductor wafer 202. As a thorough contact between semiconductor wafer 202 and a photomask (not shown) and a contamination-free backside (e.g., bottom surface 294) of semiconductor wafer 202 are desired, removal of edge beads of photoresist material 242 and/or cleaning of bottom surface 294 prior to pattern exposure may be required.

Typical solutions may involve utilizing separate dispense arms or similar elements to clean bottom surface 294 of semiconductor wafer 202 and/or edges 252 thereof. These may suffer from crudity related issues and the lack of a controlled environment for said cleaning. In one or more embodiments, photoresist coating device 102 may include a cleaning nozzle 318 (e.g., an Edge Bead Removal (EBR) nozzle) below base plate 112 in the state of engagement of base plate 112 with spin chuck 108, as shown in FIG. 3. In one or more embodiments, cleaning nozzle 318 may be configured to inject an appropriate solvent or fluid to clean bottom surface 294 of semiconductor wafer 202 and/or edges 252 of semiconductor wafer 202.

However, in one or more embodiments, in the state of engagement of base plate 112 with lid 110, cleaning nozzle 318 may be below base plate 112, as shown in FIG. 3, and out of optimal exposure thereof to bottom surface 294 of semiconductor wafer 202 and edges 252 thereof. In one or more embodiments, the engagement of base plate 112 with spin chuck 108 may enable spin chuck 108 to control motion of base plate 112. In one or more embodiments, as base plate 112 is up against lid 110, lid 110 and base plate 112 may together synchronously spin with spin chuck 108.

Figure 5:
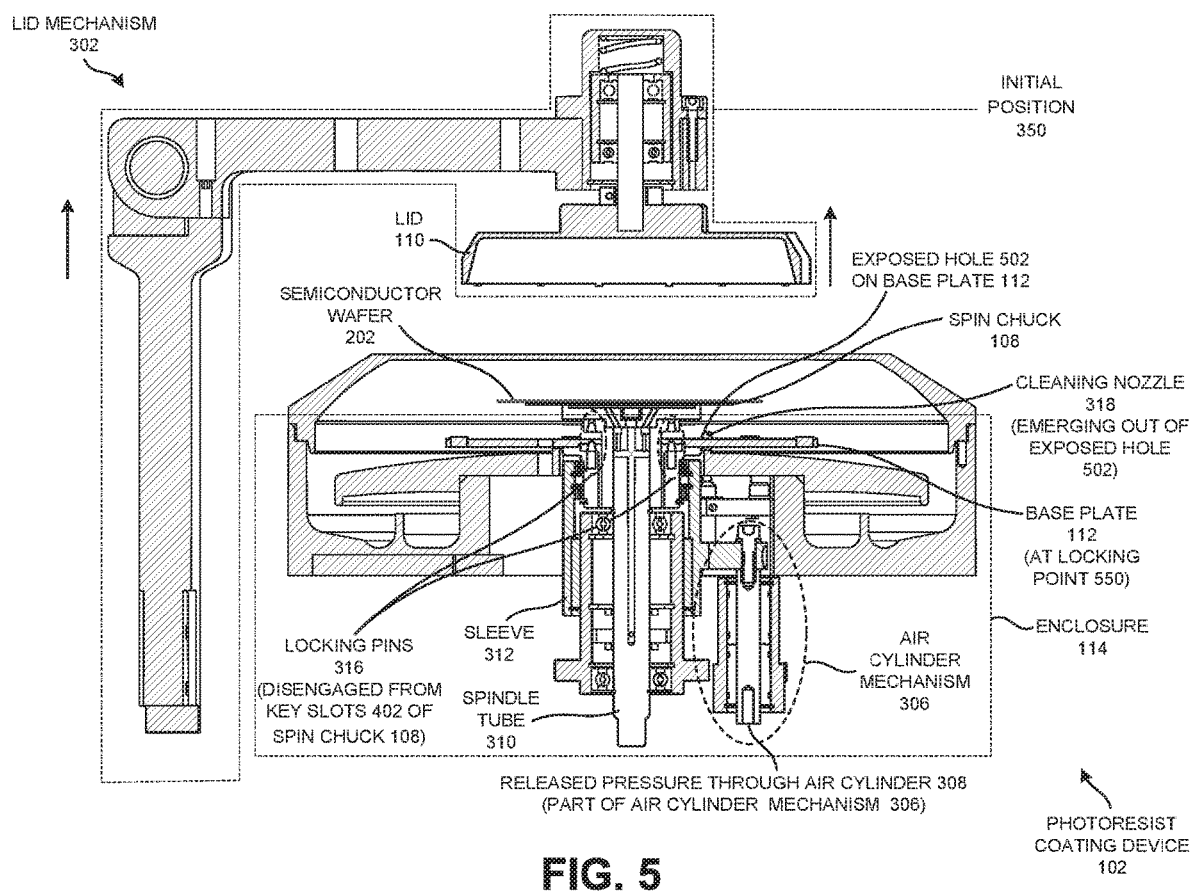
FIG. 5 is a schematic front view of disengagement of the lid from the base plate of the photoresist coating device of FIG. 1, according to one or more embodiments.

FIG. 5 shows disengagement of lid 110 from base plate 112, according to one or more embodiments; FIG. 5 is a front view thereof. In one or more embodiments, said disengagement may be triggered through data processing device 104 as part of instructions stored therein to enable cleaning of bottom surface 294 of semiconductor wafer 202 and/or edges 252 thereof. In one or more other embodiments, the disengagement may result from manual or automatic intervention on photoresist coating device 102. In one or more embodiments, as part of the disengagement, lid mechanism 302 may raise lid 110 from the lock position to disengage lid 110 from base plate 112. In one or more embodiments, said disengagement may result in lid 110 going back to initial position 350.

In one or more embodiments, air cylinder mechanism 306 may then lower (e.g., release) the pressure through air cylinder 308 to release the mechanism attached to spindle tube 310. In other words, in one or more embodiments, the lowering of pressure through air cylinder 308 may cause sleeve 312 around spindle tube 310 to be lowered, thereby disengaging base plate 112 from spin chuck 308. In one or more embodiments, as part of the disengagement of base plate 112 from spin chuck 308, locking pins 316 of base assembly 314 may be disengaged from corresponding key slots 402 of spin chuck 108. In one or more embodiments, this may result in spin chuck 108 being able to move and spin freely of base plate 112.

In one or more embodiments, the disengagement of base plate 112 from spin chuck 308 may cause base plate 112 to be lowered. In some embodiments, the lowering of base plate 112 may continue until a point of locking thereof (FIG. 5 shows the direction of movement of base plate 112 till a locking point 550); said locking may be due to cleaning nozzle 318 poking out through an exposed hole 502 in base plate 112. It should be noted that, in one or more embodiments, cleaning nozzle 318 may, thus, be enabled to clean and/or wash bottom surface 294 of semiconductor wafer 202 and/or edges 252 thereof following the lowering (e.g., to locking point 550) of base plate 112. While exposed hole 502 may be one means to optimally expose cleaning nozzle 318 to bottom surface 294 of semiconductor wafer 202 and/or edges 252 thereof for washing/cleaning, other means therefor are within the scope of the exemplary embodiments discussed herein.

While FIG. 3 shows only one cleaning nozzle 318, it should be noted that more than one cleaning nozzle 318 at appropriate locations are within the scope of the exemplary embodiments discussed herein. To generalize, the lowering of base plate 112 may optimally expose a "cleaning mechanism" (e.g., cleaning nozzle 318; other forms of and means for washing and/or cleaning are within the scope of the exemplary embodiments discussed herein) to bottom surface 294 of semiconductor wafer 202 and/or edges 252 thereof for washing and/or cleaning. As discussed above, in one or more embodiments, the disengaged base plate 112 may be independent of the spinning of spin chuck 108. Conversely, in one or more embodiments, spin chuck 108 may now be able to spin independently of base assembly 314 including base plate 112.

In one or more embodiments, at locking point 550 of base plate 112, cleaning nozzle 318 may be configured to eject a stream of an appropriate solvent to clean/wash bottom surface 294 of semiconductor wafer 202 and/or edges 252 thereof. In some other embodiments, the generalized "cleaning mechanism" may employ appropriate brushes (not shown) to clean and/or wash bottom surface 294 of semiconductor wafer 202 and/or edges 252 thereof.

Thus, exemplary embodiments discussed herein dispense with the need for introduction of one or more outside dispense arm(s) to clean bottom surface 294 of semiconductor wafer 202 and/or edges 252 thereof, thereby preventing additional defects and/or chemical/particle contamination. Further, exemplary embodiments constitute the first-of-kind engagement/disengagement mechanism of base plate 112 with respect to spin chuck 108 in a photoresist coating device (e.g., photoresist coating device 102) to enable optimal exposure of a cleaning mechanism to bottom surface 294 of semiconductor wafer 202 and/or edges 252 thereof. Still further, exemplary embodiments provide for a low turbulence environment for the spinning of semiconductor wafer 202, for planarization of top surface 292 of semiconductor wafer 202 and for reduced chemical usage (e.g., of photoresist material 242, one or more cleaning solvents) therefor.

It should be noted that air cylinder mechanism 306 discussed above may generically be called "actuator mechanism" to activate and raise/lower sleeve 312 around spindle tube 310 to engage/disengage base plate 112 with/from spin chuck 108; photoresist coating device 102 may generically be called "spin coating device." Also, it should be noted that concepts related to exemplary embodiments discussed herein may be applicable to any "substrate material" (of which semiconductor wafer 202 is only one example) whose bottom surface (e.g., bottom surface 294) and/or edges (e.g., 252) need to be washed and/or cleaned. Again, photoresist material 242 may be merely one example of a "film-forming substance" configured to be coated on a top surface (e.g., top surface 292) of the substrate material. Cleaning and/or washing thereof are within the scope of the exemplary embodiments discussed herein.

Figure 6:
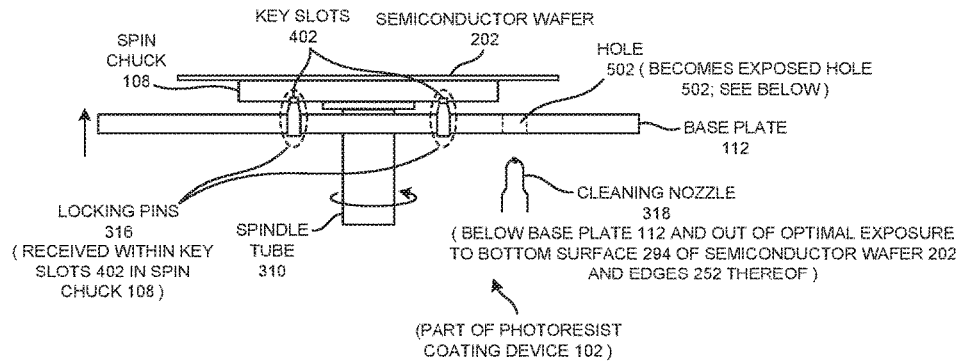
FIG. 6 is a schematic view of a specific summary of operations represented through FIG. 3 and FIG. 5, according to one or more embodiments.
Figure 6:
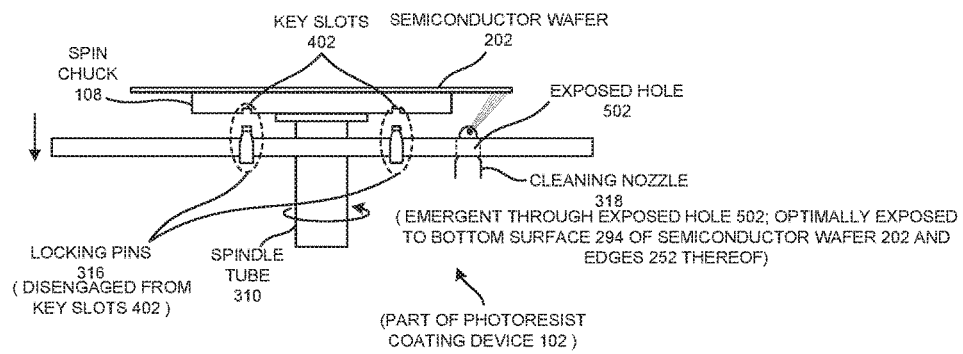

FIG. 6 summarizes the engagement of base plate 112 with spin chuck 108 of photoresist coating device 102, as discussed with regard to FIG. 3, and the disengagement of base plate 112 from spin chuck 108 of photoresist coating device 102, as discussed with regard to FIG. 5, according to one or more embodiments. Again, in some alternate embodiments (not shown for obviousness purposes), key slots analogous to key slots 402 may be on base plate 112/base plate assembly 314 instead of on spin chuck 108 and locking pins analogous to locking pins 316 may be on spin chuck 108 instead of base plate assembly 314. As discussed above, all operations related to movement(s) of components of photoresist coating device 102 may be automatically triggered through data processing device 104 configured to read and execute instructions embodied in a non-transitory machine readable medium (e.g., a hard disk/drive, a Digital Video Disc (DVD), a Compact Disc (CD), a Blu-ray Disc™) All reasonable variations are within the scope of the exemplary embodiments discussed herein.

Figure 7:
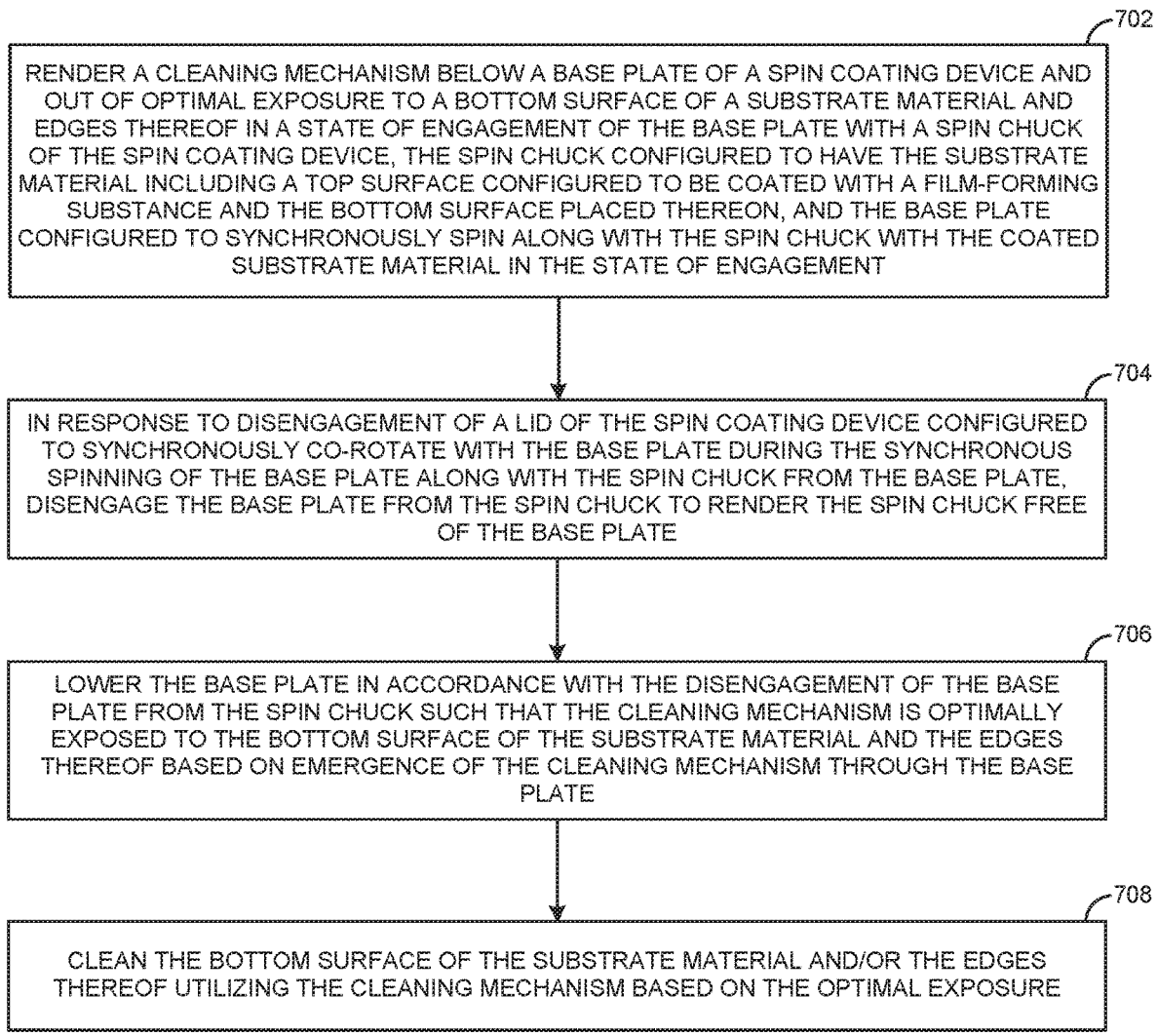
FIG. 7 is a process flow diagram detailing the operations involved in enabling cleaning a bottom surface of a substrate material and/or edges thereof in a spin coating device, according to one or more embodiments.

FIG. 7 shows a process flow diagram detailing the operations involved in enabling cleaning a bottom surface (e.g., bottom surface 294) of a substrate material (e.g., semiconductor wafer 202) and/or edges (e.g., edges 252) thereof in a spin coating device (e.g., photoresist coating device 102), according to one or more embodiments. In one or more embodiments, operation 702 may involve rendering a cleaning mechanism (e.g., cleaning nozzle 318) below a base plate (e.g., base plate 112) of the spin coating device and out of optimal exposure to the bottom surface of the substrate material and/or the edges thereof in a state of engagement of the base plate with a spin chuck (e.g., spin chuck 108) of the spin coating device. In one or more embodiments, the spin chuck may be configured to have the substrate material including a top surface (e.g., top surface 292) and the bottom surface placed thereon.

In one or more embodiments, the top surface may be a surface configured to be coated with a film-forming substance (e.g., photoresist material 242). In one or more embodiments, the base plate may be configured to synchronously spin along with the spin chuck with the coated substrate material in the state of engagement. In one or more embodiments, in response to disengagement of a lid (e.g., lid 110) of the spin coating device configured to synchronously co-rotate with the base plate during the synchronous spinning of the base plate along with the spin chuck from the base plate, operation 704 may involve disengaging the base plate from the spin chuck to render the spin chuck free of the base plate.

In one or more embodiments, operation 706 may involve lowering the base plate in accordance with the disengagement of the base plate from the spin chuck such that the cleaning mechanism is optimally exposed to the bottom surface of the substrate material and/or the edges thereof based on emergence of the cleaning mechanism through the base plate. In one or more embodiments, operation 708 may then involve cleaning the bottom surface of the substrate material and/or the edges thereof utilizing the cleaning mechanism based on the optimal exposure.

Although the present embodiments have been described with reference to specific example embodiments, it will be evident that various modifications and changes may be made to these embodiments without departing from the broader spirit and scope of the various embodiments. Accordingly, the specification and drawings are to be regarded in an illustrative rather than a restrictive sense.

What is claimed is:
1. A spin coating device comprising:
a base plate assembly comprising a base plate and a plurality of locking pins;
a spin chuck on which a substrate material is configured to be placed, the substrate material comprising a top surface and a bottom surface, the top surface being a surface configured to be coated with a film-forming substance, the spin chuck comprising a plurality of key slots corresponding to the plurality of locking pins of the base plate assembly;
an actuator mechanism configured to engage the base plate with the spin chuck by way of the plurality of locking pins of the base plate assembly engaging with the plurality of key slots of the spin chuck such that the base plate is configured to synchronously spin along with the spin chuck, the base plate being completely under the spin chuck even in a state of the engagement of the base plate with the spin chuck;

a cleaning nozzle below the base plate and out of optimal exposure to the bottom surface of the substrate material and edges thereof in the state of the engagement of the base plate with the spin chuck; and a lid configured to engage with the base plate to synchronously co-rotate with the base plate during the synchronous spinning of the base plate along with the spin chuck, the engagement of the lid with the base plate and the synchronous co-rotation thereof enabling a low turbulene environment for distribution of the film-forming substance across the top surface of the substrate material, wherein the actuator mechanism is further configured to:
in response to disengagement of the lid from the base plate, disengage the plurality of locking pins of the base plate from the plurality of key slots of the spin chuck to lower the base plate such that the base plate is disengaged from the spin chuck to render the spin chuck free of the base plate, and wherein the lowering of the base plate proceeds to a locking point whereupon a portion of the cleaning nozzle below the base plate passes through a hole in the base plate and emerges completely out of and above the base plate such that the cleaning nozzle is optimally exposed to the bottom surface of the substrate material and the edges thereof.

2. The spin coating device of claim 1, wherein:
the substrate material is a semiconductor wafer.

3. The spin coating device of claim 1, wherein the actuator mechanism is associated with an air cylinder configured to be:
pressurized to enable the engagement of the base plate with the spin chuck based on movement of the base plate upward toward the spin chuck, and
released of pressure to enable the disengagement of the base plate from the spin chuck.

4. The spin coating device of claim 3, wherein:
the spin chuck is associated with a spindle tube configured to serve as an axis of rotation thereof.

5. The spin coating device of claim 1, wherein the film-forming substance is a photoresist material.

6. The spin coating device of claim 1, wherein the cleaning nozzle is an Edge Bead Removal (EBR) nozzle.

7. The spin coating device of claim 4, wherein a sleeve around the spindle tube is configured to be raised based on the pressurization through the air cylinder to enable the movement of the base plate upward toward the spin chuck.

* * * * *